(12) United States Patent
Kanjanavikat (10) Patent No.: US 6,370,785 B1
(45) Date of Patent: Apr. 16, 2002

(54) STRIP COUNTING GAUGE

(75) Inventor: Adisorn Kanjanavikat, Bangkok (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 28 days.

(21) Appl. No.: 09/616,387

(22) Filed: Jul. 14, 2000

(51) Int. Cl.$^7$ ................................................ G01B 3/00
(52) U.S. Cl. ..................... 33/492; 33/494; 33/679.1; 29/827; 209/722; 209/459.1
(58) Field of Search .................... 33/483, 492, 494, 33/679.1; 29/827; 206/459.1, 722

(56) References Cited

U.S. PATENT DOCUMENTS

| | | | | |
|---|---|---|---|---|
| 205,795 A | * | 7/1878 | Green ........................... | 33/492 |
| 543,997 A | * | 8/1895 | Mallin .......................... | 33/494 |
| 563,510 A | * | 7/1896 | Savidge ........................ | 33/492 |
| 1,677,821 A | * | 7/1928 | Graham ........................ | 33/494 |
| 3,790,762 A | * | 2/1974 | Redman et al. ................ | 377/53 |
| 3,805,390 A | * | 4/1974 | Craig ........................... | 33/494 |
| 4,910,866 A | | 3/1990 | Allen ........................... | 29/827 |
| 5,111,935 A | | 5/1992 | Bond et al. ................... | 206/713 |
| 5,182,851 A | | 2/1993 | Bond et al. ................... | 29/827 |
| 5,761,819 A | * | 6/1998 | Ledy-Gurren .............. | 33/679.1 |
| 5,830,403 A | | 11/1998 | Fierkens ................. | 264/272.13 |
| 6,000,901 A | | 12/1999 | Fierkens ................. | 414/416.09 |
| 6,098,301 A | * | 8/2000 | Kapphahn .................... | 33/492 |

* cited by examiner

*Primary Examiner*—Randy W. Gibson
(74) *Attorney, Agent, or Firm*—Eschweiler & Associates LLC (57) ABSTRACT

The present invention relates to a leadframe stip counting gauge and comprises a gauge member having an engagement portion adapted for association with a leadframe carrier having leadframes contained therein. The leadframe strip counting gauge further comprises leadframe count indicia associated with the gauge member, wherein the indicia are spatially distributed with respect to the gauge member and are adapted to provide a count representing a number of leadframes residing in the leadframe carrier. The present invention also relates to a method of counting leadframes residing in a leadframe carrier, and comprises positioning a leadframe counting member near a leadframe carrier containing leadframes therein. The method further comprises determining a number of leadframes in the leadframe carrier using leadframe count indicia associated with the leadframe counting member.

15 Claims, 6 Drawing Sheets

STRIP COUNTING GAUGE

FIELD OF THE INVENTION

The present invention relates generally to semiconductor manufacturing, and more particularly to a gauge and method for counting accurately and efficiently a number of leadframes residing in a leadframe carrier or magazine.

BACKGROUND OF THE INVENTION

Integrated semiconductor devices are typically constructed "en masse" on a wafer of silicon. Each device generally takes the form of an integrated circuit (IC) die, which is bonded to the die-mounting pad of a leadframe. The wire attachment pads on the die are connected with their corresponding leads on the leadframe typically with aluminum or gold wire during a wire bonding process. The die and leadframe are then encapsulated in a plastic or ceramic package, which is then recognizable as an IC "chip". Since nine or more leadframes are typically interconnected as a leadframe strip during the manufacturing process, a trim and form operation separates the individual chips from the leadframe strip and forms (bends) the leads of the chip into the required configuration. IC chips come in a variety of forms such as microprocessors, dynamic random access memory (DRAM) chips, static random access memory (SRAM) chips, flash memory chips, gate arrays, etc. The chips are interconnected in myriad combinations on printed circuit boards, along with other types of discrete components such as resistors and capacitors, by any number of techniques, such as socketing and soldering.

Figure 1:
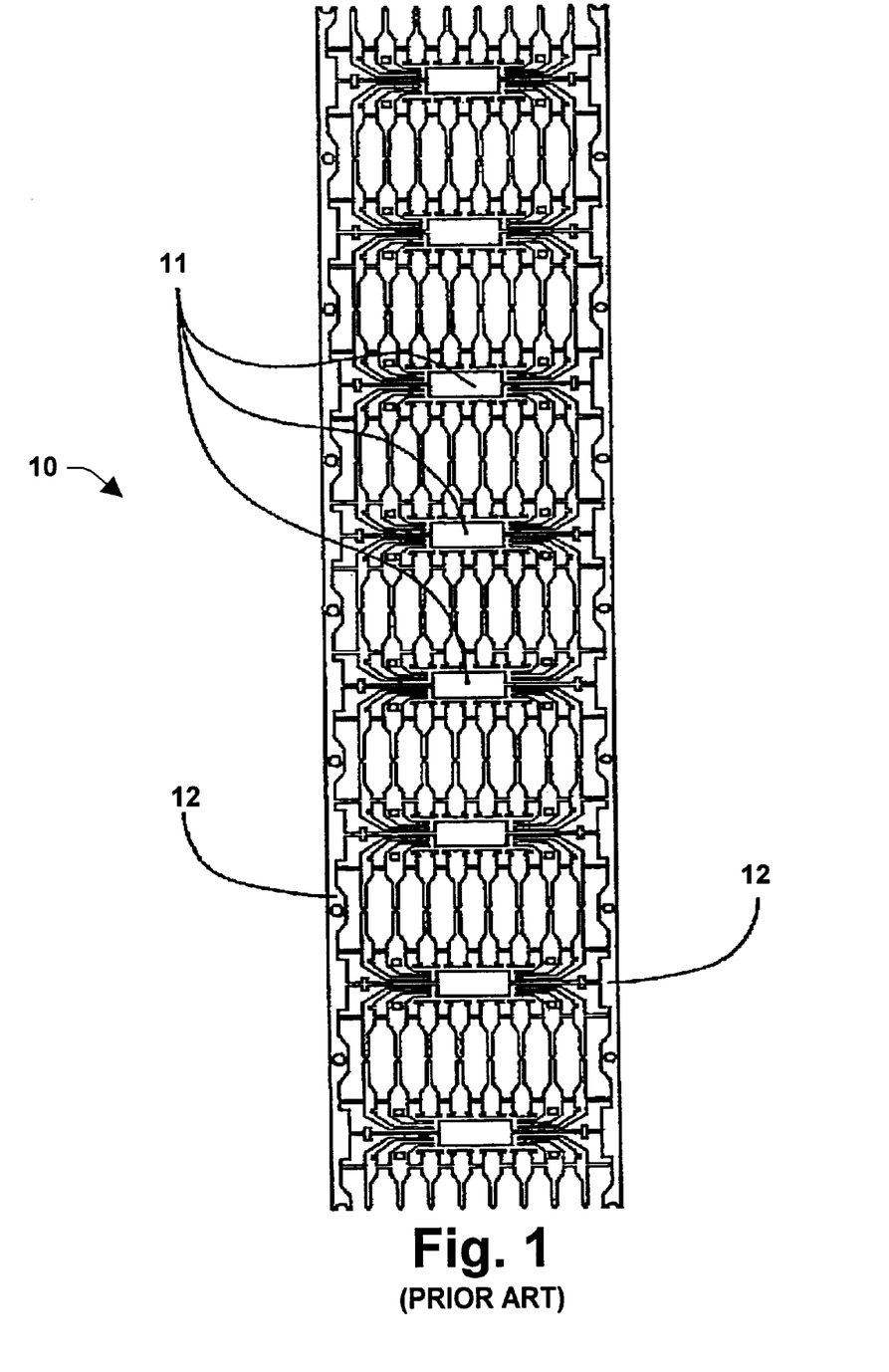
FIG 1 is a prior art plan view of a leadframe strip employed in back-end semiconductor processing.
Figure 2:
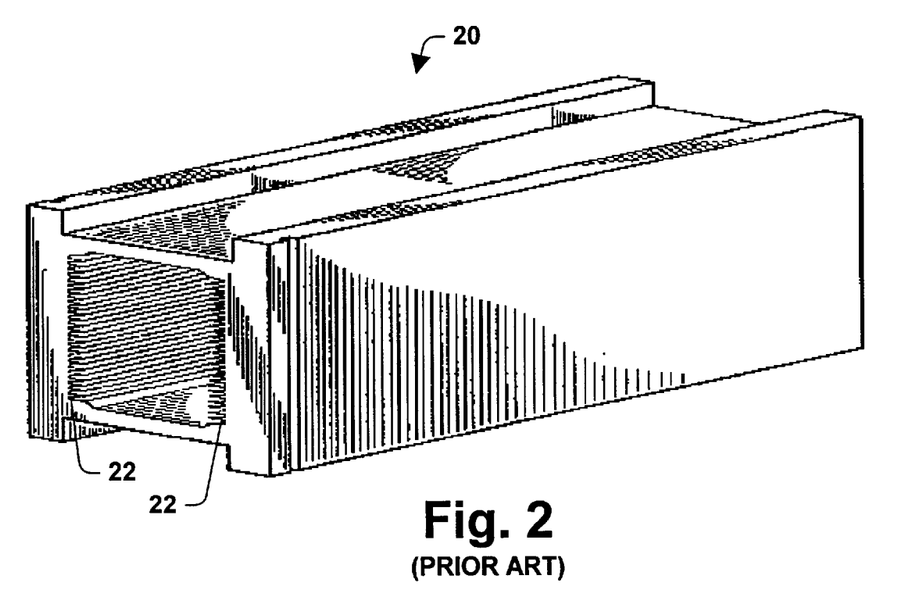
FIG. 2 is a prior art perspective view illustrating an extruded leadframe carrier used to transport leadframe strips between various process stations during back-end semiconductor processing.

An example of a typical leadframe strip is depicted in FIG. 1, and designated at reference numeral 10. From the point in the manufacturing process where the pads 11 of a leadframe strip are coated with adhesive prior to die bonding until the point where the individual chips are separated from the leadframe strip rails 12 during a trim and form process, the leadframe strip 10 is treated as a single unit in the manufacturing process. Automatic handling machinery is designed to retrieve the partially complete leadframe strip assemblies from leadframe storage devices commonly called leadframe carriers or magazines. One type of prior art leadframe strip carrier is depicted in FIG. 2, and designated at reference numeral 20. The interior of the carrier 20 has a pair of opposed mirror-image grooved faces 22. Each groove on one face and its mirror-image groove on the opposing face acts as a slot into which a single lead frame strip 10 may be inserted. The carrier 20 of FIG. 2, for example, is capable of supporting twenty-seven leadframe strips. This prior art leadframe strip carrier suffers from two drawbacks: high cost of manufacture and inconvenient design.

The leadframe strip carrier of prior art FIG. 2 is expensive, for example costing up to about $250 per unit. This cost is especially significant considering that a semiconductor manufacturer may need several thousand carriers of various sizes, and since the carriers are subject to damage and wear during the semiconductor manufacturing process, they are not expected to last much more than a single year.

Another form of leadframe carrier or magazine is illustrated in FIGS. 3a–3d, and is designated at reference numeral 30. The leadframe carrier 30 has several advantages over the carrier 20 of prior art FIG. 2. The leadframe carrier 30 has a generally flat bottom portion 32 and C-shaped side portions 34 and 36, respectively, which collective work to contain a stack of leadframes 38 therein (see, e.g., FIG. 3c). The carrier 30 does not have the high precision grooves of carrier 20; consequently the insertion and removal of leadframes from the carrier 30 is relatively simple. Furthermore, the structure of the carrier 30 makes production of the carrier relatively inexpensive and a single type of carrier 30 may be utilized for multiple types of leadframe strips.

Because of the advantages associated with the leadframe carriers 30 of FIGS. 3a–3d, such leadframe carriers are commonly used in semiconductor back-end manufacturing to carry the leadframe strips from one process to another, for example, from mold to post-mold cure, solder plating, trim and form processes, etc. One full carrier of SOIC44 leadframe strips contains, for example, 120 strips. The number of leadframe strips contained within the leadframe carrier need to be known and thus counted in at least the following events: (1) to identify the number of strips residing in a partial (last) carrier of a production lot, (2) to identify the number of strips within a carrier in the event that leadframe strips are transferred from one carrier to another, and (3) to identify the number of remaining strips within the leadframe carrier to confirm the proper number of strips after a machine jams or another "hick-up" occurs in the process.

Figure 3A:
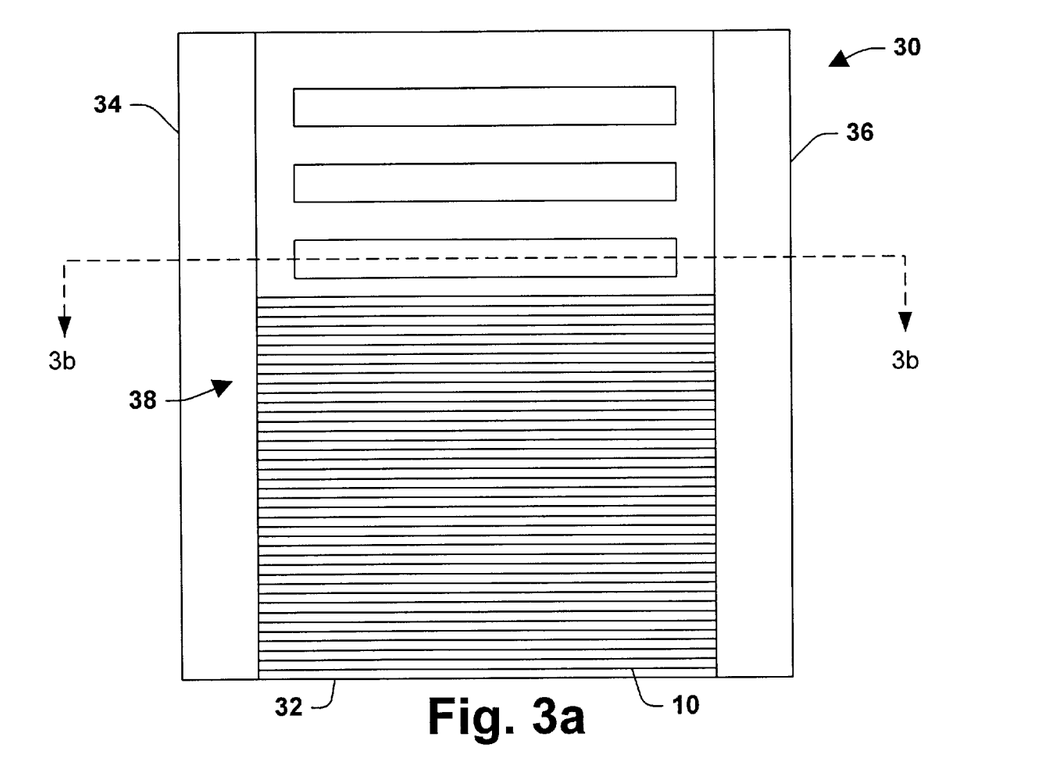
FIG. 3a is a prior art front view of another form of leadframe carrier or magazine used to transport leadframe strips between various process stations during back-end semiconductor processing.
Figure 3B:
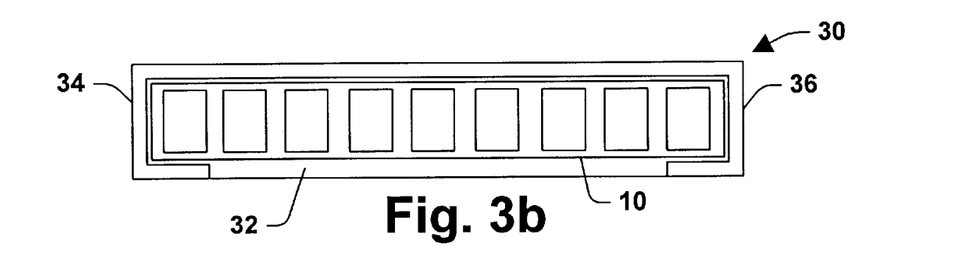
FIG. 3b is a cross section of a leadframe carrier of FIG. 3a taken along dotted line 3b—3b thereof, and illustrating a body portion of the carrier used for storing and transporting leadframes strips in back-end semiconductor processing.
Figures 3C, 3D:
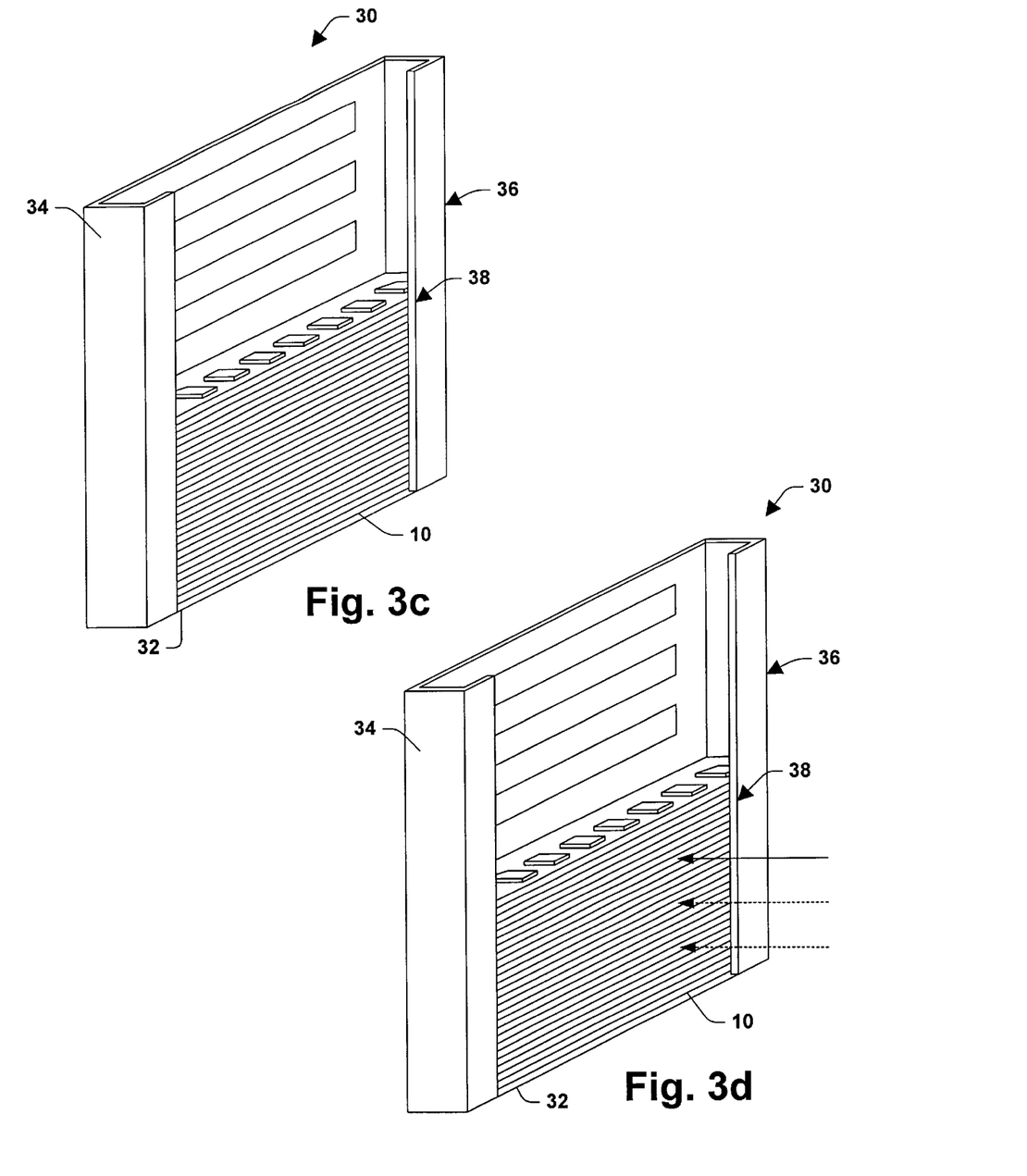
FIG. 3c is a perspective view of the leadframe carrier of FIG. 3a illustrating the leadframe carrier having an undetermined number of leadframe strips residing therein.
FIG. 3d is a perspective view of the leadframe carrier of FIG. 3a illustrating a prior art method of counting the undetermined number of leadframes residing within the leadframe carrier using a pointer type apparatus and individually counting the leadframe strips.

Normally, strips 10 in the leadframe carriers 30 are counted manually using a pointer or a pair of tweezers, as illustrated in FIG. 3d. Such manual counting is a time consuming process, for example, taking an average of 60 seconds per carrier (not including recounts). In addition, the manual counting method is prone to errors. Clearly, there is a need in the art for a system and method of accurately and efficiently determining the number of leadframe strips within a leadframe carrier or magazine.

SUMMARY OF THE INVENTION

The present invention relates to a system and method for accurately and efficiently determining a number of leadframe strips within a leadframe carrier or magazine.

According to the present invention, a leadframe strip counting gauge and a method of counting leadframes using such a gauge is disclosed. The leadframe strip counting gauge comprises an elongate member having a lateral edge that contains a series of periodic variations such as notches thereon. The periodic variations generally coincide with the spatial period of the leadframes when stacked within the leadframe carrier. The gauge further comprises leadframe count indicia such as numbers associated with the elongate member which coincide generally with the periodic variations. The gauge may be used to count the number of leadframes within the leadframe carrier by placing the gauge near or in contact with the leadframe carrier such that the lateral edge is near or abuts the stack of leadframes therein. By evaluating the leadframe count indicia associated with the gauge and the leadframe stack near the indicia, an accurate leadframe count may be achieved in an efficient manner.

According to one aspect of the present invention, a leadframe strip counting gauge comprises a gauge member having an engagement portion which is adapted for subsequent association with a leadframe carrier having leadframes contained therein. The gauge further comprises leadframe count indicia associated with the gauge member. The leadframe count indicia may be spatially distributed with respect to the gauge member and is adapted to provide a count representing the number of leadframes residing within the leadframe carrier.

According to another aspect of the present invention, the engagement portion of the gauge member comprises a periodically varying lateral edge having a spatial period which coincides generally with a spatial period of the leadframes as stacked in the leadframe carrier or magazine. Further, the periodically varying lateral edge may constitute notches formed therein, and when the gauge is brought into contact with the stacked leadframes, the periodically varying lateral edge engages the leadframes such that each leadframe strip engages a separate lateral edge variation, respectively.

According to yet another aspect of the present invention, each notch associated with the gauge member comprises a first and second angled edge, respectively. The first angled edge exhibits a positive slope while the second angled edge exhibits a negative slope; and the angled edges intersect one another to form a trough. The angle formed between the first angled edge and a plane perpendicular to the gauge length positioned at the trough is about 10 degrees and the angle formed between the second angled edge and the same plane is about negative 10 degrees, respectively.

According to still another aspect of the present invention, a method of counting leadframes residing in a leadframe carrier comprises positioning a leadframe counting member near a leadframe carrier containing leadframes therein. The method further comprises the step of determining the number of leadframes in the leadframe carrier using leadframe count indicia associated with the leadframe counting member.

According to another aspect of the present invention, a method of counting leadframes residing in a leadframe carrier comprises generally abutting the leadframe counting member against the leadframe carrier such that an engagement portion of the counting generally contacts the leadframes stacked within the leadframe carrier. The engagement portion may comprise a periodically varying lateral edge having a spatial period which generally coincides with a spatial period of the stacked leadframes such that each leadframe engages individually a variation associated with the lateral edge of the counting member.

To the accomplishment of the foregoing and related ends, the invention, then, comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The present invention will now be described with reference to the drawings, wherein like reference numerals are used to refer to like elements throughout. The present invention is directed toward an apparatus and method of counting leadframe strips residing in a leadframe carrier or magazine. The invention comprises a leadframe strip counting gauge having an elongate member. The member includes an engagement portion such as a lateral edge having spatially periodic variations along its length such as notches. The leadframe strip counting gauge also comprises leadframe count indicia associated with the elongate member, for example, numbers placed along the lateral edge such as labels. By placing the leadframe strip counting gauge near the leadframe carrier, for example, by abutting a side portion of the carrier therewith, one can readily ascertain the number of leadframes engaging the engagement portion using the count indicia and thus determine accurately and efficiently the number of leadframes residing within the leadframe carrier.

Figures 4A, 4B, 5:
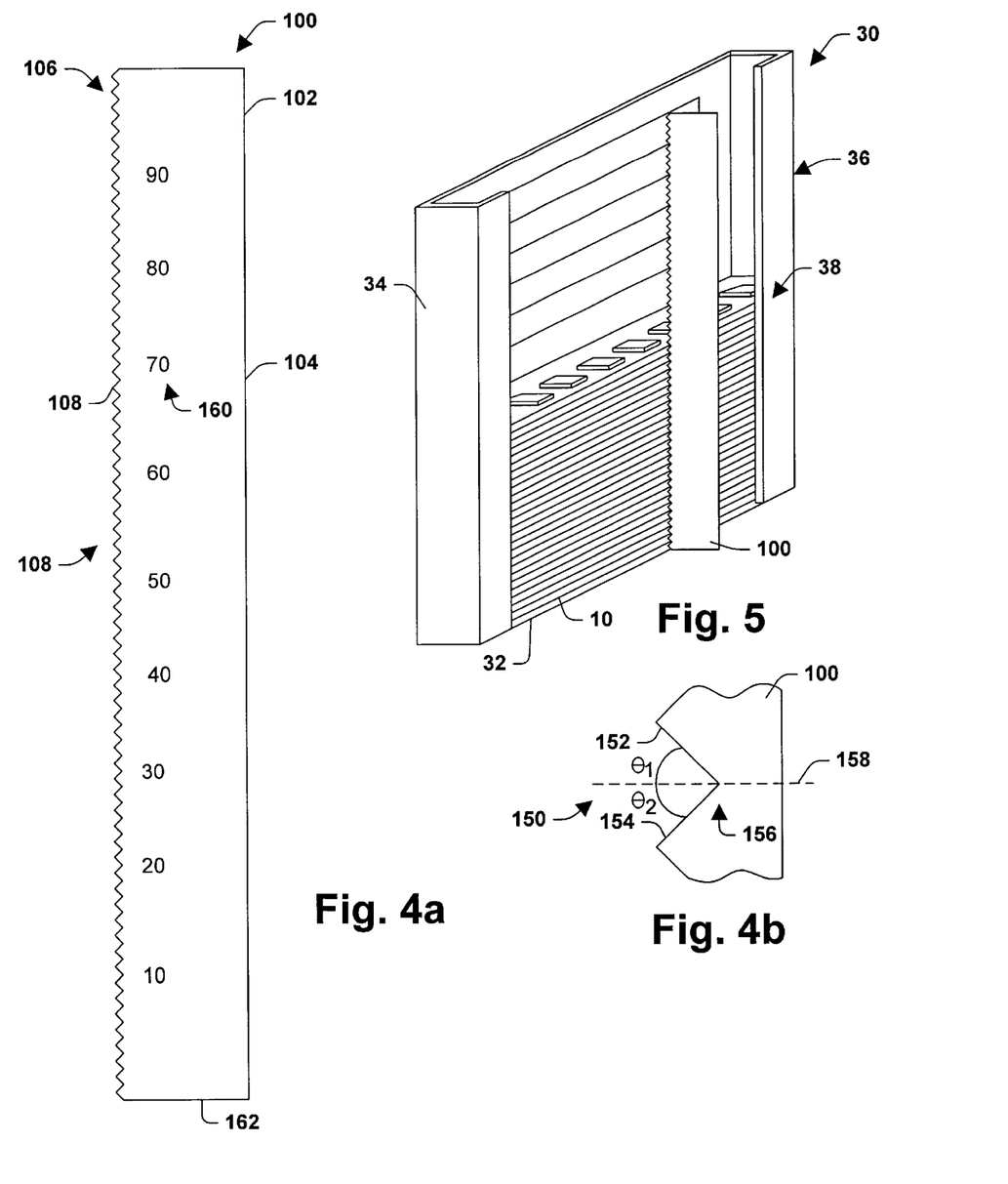
FIG. 4a is a side view of a leadframe strip counting gauge for counting leadframe strips residing within a leadframe carrier or magazine according to the present invention.
FIG. 4b is a fragmentary side view illustrating a portion of the lateral edge of the leadframe strip counting gauge according to an exemplary aspect of the present invention.
FIG. 5 is a perspective view of the leadframe carrier of FIG. 3a, wherein a leadframe strip counting gauge is utilized to count the leadframe strips residing therein according to one exemplary aspect of the present invention.

Turning now in detail to the figures, FIG. 4a illustrates an exemplary leadframe strip counting gauge according to the present invention, and is designated at reference numeral 100. The counting gauge 100 comprises generally a gauge member 102 which may take a variety of shapes, for example, an elongate, generally rectangular shape as illustrated in FIG. 4a. Alternatively, however, any shape gauge member which may be manipulated or otherwise actuated (manually or mechanically), for example, on a side 104, may be utilized and is contemplated as falling within the scope of the present invention.

The counting gauge 100 of FIG. 4a also comprises an engagement portion 106 which is adapted for association with a leadframe carrier such as the carrier 30 illustrated in FIG. 5. The engagement portion 106 is adapted or otherwise configured to engage the leadframe carrier 30 so as to facilitate a determination of a count representing the number of leadframe strips within the carrier 30, as will be described in greater detail below. According to one exemplary aspect of the present invention, the engagement portion 106 comprises a lateral edge 108 having periodic variations along its length. Such variations may constitute, for example, notches, although other type variations may also be utilized. For example, the variations may be generally sinusoidal in nature, however, any variations along the lateral edge 108 which facilitate the functionality described herein may be utilized and are contemplated as falling within the scope of the present invention.

According to one exemplary aspect of the present invention, the spatial period of the periodic variations (e.g., notches) generally coincides with a spatial period of the leadframes as contained in the leadframe carrier 30 (see, e.g., FIG. 5). For example, to the extent that the leadframe strips are stacked within the leadframe carrier 30 as illustrated in FIG. 5, the stack 38 of leadframes has a generally constant spatial period associated therewith. Furthermore, in other containment methodologies, the leadframes will also have a generally ordered configuration. By having the spatial periodicity of the lateral edge variations generally coincide with the spatial periodicity of the leadframe strips as contained within the carrier, ascertaining the number of strips within the carrier is facilitated.

According to one exemplary aspect of the present invention, having the spatial periodicity of the lateral edge variations generally coincide with the leadframe strip spatial period comprises employing a 1:1 correspondence, wherein a single edge variation corresponds to one stacked leadframe strip (see, e.g., FIG. 5). Alternatively, however, one lateral edge variation may coincide with multiple stacked leadframe strips (e.g., employing a 1:N correspondence, wherein N may be an integer). However, any type of spatial correspondence may be utilized and is contemplated as falling within the scope of the present invention.

As discussed above briefly, the periodic variations along the lateral edge of the engagement portion 106 may constitute notches. According to one exemplary aspect of the present invention, the notches may be constructed in a manner as shown in FIG. 4b, and designated by reference numeral 150. The notch 150 comprises, for example, a first angled edge 152 having a positive slope and a second angled edge 154 having a negative slope, respectively. The angled edges 152 and 154 intersect one another to form a trough 156. The slopes of the edges 152 and 154 have angles that are measured by their edge with respect to a plane 158 which is generally perpendicular to the length of the gauge 100 and positioned at the trough 156, as illustrated in FIG. 4b. According to one exemplary aspect of the present invention, $\theta_1=10$ degrees and $\theta_2=-10$ degrees, respectively, however, the angles need not be symmetric and further may vary, and any such variations are contemplated as falling within the scope of the present invention.

The leadframe counting gauge 100 further comprises leadframe count indicia 160 associated therewith. According to one exemplary aspect of the present invention, the indicia 160 are physically located on the gauge member 102, however, other manners of associating the indicia 160 with the elongate gauge member 102 may be utilized and are contemplated as falling within the scope of the present invention. In addition, the indicia 160 are spatially distributed with respect to the gauge member 102 and are adapted to provide a count representing a number of leadframes residing in the leadframe carrier. For example, the indicia 160 may be distributed in a generally vertical manner along the elongate gauge member 102, as illustrated in FIG. 4a.

According to one exemplary aspect of the present invention, the indicia 160 comprise numbers that coincide directly with the number of variations along the lateral edge 108. That is, a number "10" is located on the engagement portion 106 of the gauge member 102 at a location corresponding to the tenth spatial variation (e.g., the tenth notch) from a bottom portion 162 thereof. Note that the exemplary indicia 160 of FIG. 4a do not necessarily correspond directly to the variations as described above, but rather are shown merely for purposes of ease of illustration.

Although numbers may be etched, labeled or otherwise marked on the counting gauge 100, other indicia systems and methodologies may be employed and are contemplated as falling within the scope of the present invention. For example, instead of indicia being physically associated with the lateral edge variations in a spatial manner, the indicia 160 may be electrically, mechanically or chemically associated therewith, as may be desired. For example, microminiature sensors (not shown) may reside along the lateral edge 108 of the engagement portion 106 and may communicate one or more electrical signals to a control circuit (not shown) associated with the gauge 100 to provide an electrical output indicating a number of leadframe strips in the carrier using, for example, an liquid crystal display (LCD) associated with the counting gauge 100. According to another exemplary alternative of the present invention, a piezoelectric film (not shown) may reside along the lateral edge 108 and when the counting gauge 100 abuts the stacked leadframe strips, the compression of a portion of the film corresponding to the height of strips in the carrier generates an electrical signal that correlates to a number of strips in the stack, which is then displayed as the indicia 160. Therefore as can be seen from the above examples, the leadframe count indicia 160 of the present invention is to be interpreted in its broadest sense.

Figure 6:
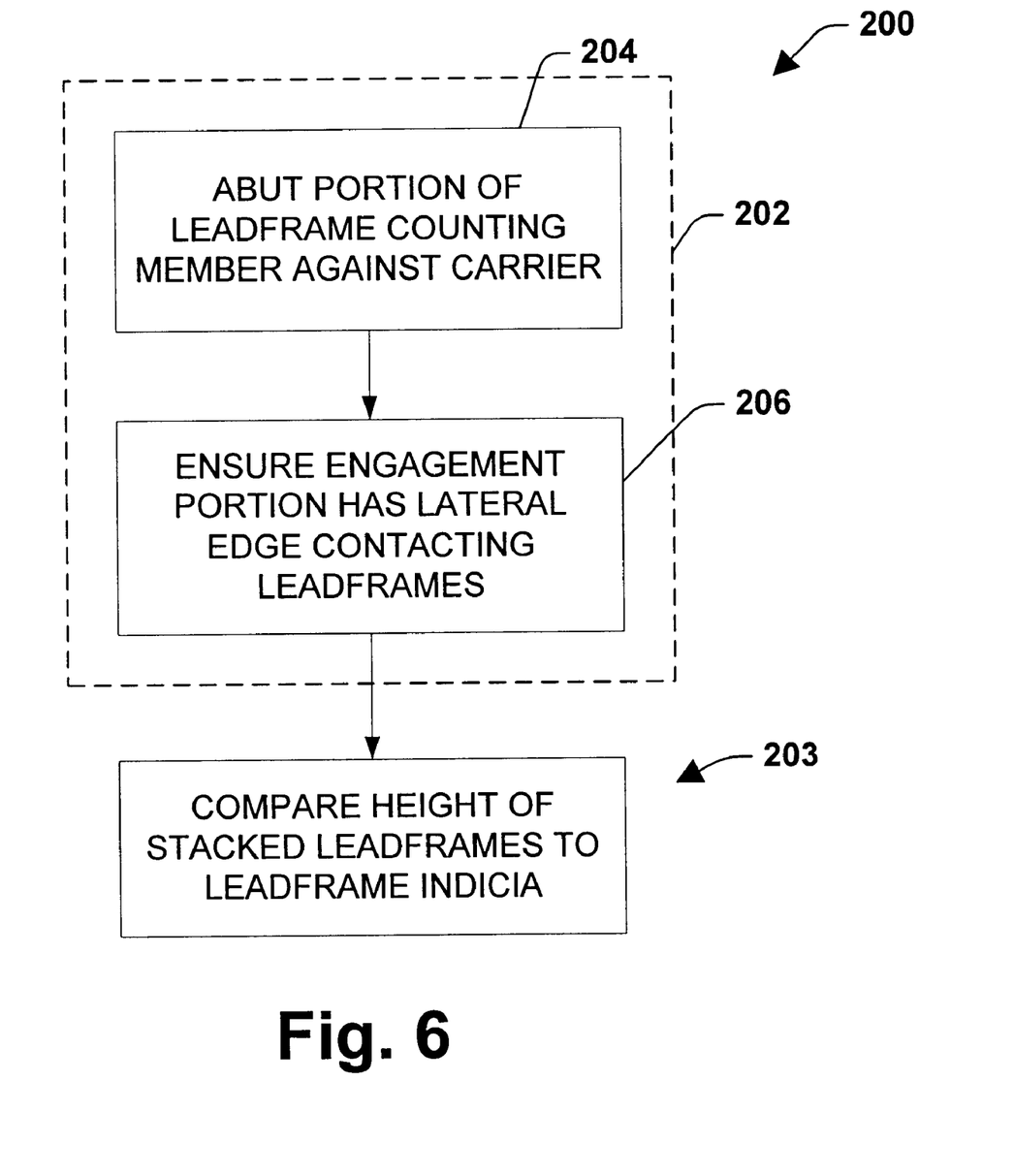
FIG. 6 is a flow chart illustrating a method of counting leadframes within a leadframe carrier using a leadframe counting mechanism such as the leadframe strip counting gauge of FIG. 4 according to the present invention.

According to yet another aspect of the present invention, a method of counting leadframes residing in a leadframe carrier is disclosed and will be discussed in conjunction with FIGS. 5 and 6, respectively. The method, as illustrated in FIG. 6 and designated at reference numeral 200, comprises the steps of positioning a leadframe counting member near a leadframe carrier containing leadframes therein at step 202 and then determining a number of leadframes in the leadframe carrier using leadframe count indicia associated with the leadframe counting member at step 203. As will be indicated in greater detail below, the present invention contemplates any combination of steps to effect the above functionality and any such combination of steps is contemplated as falling within the scope of the present invention.

According to one exemplary aspect of the present invention, the positioning of the leadframe counting member near the leadframe (step 202) comprises abutting a portion of the leadframe counting member against the leadframe carrier at step 204 and then ensuring that the engagement portion has its lateral edge contacting the leadframes at step 206 so as to ensure an accurate leadframe count by establishing an accurate correlation to the count indicia associated with the leadframe counting device. According to one aspect of the present invention, the leadframe counting device comprises the leadframe strip counting gauge 100 of FIG. 4a.

According to another exemplary aspect of the present invention, the step of determining a number of leadframes using the leadframe count indicia associated with the leadframe counting member (step 203) comprises comparing a height of the stacked leadframes to the corresponding leadframe indicia. For example, the bottom of the leadframe counting member is placed at a bottom portion of the leadframe carrier, and the top leadframe strip in the stack engages a particular location on the engagement portion of the leadframe counting member. By analyzing the leadframe count indicia associated with that particular location, a count representing the number of leadframes within the leadframe carrier is accurately and efficiently determined.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description and the claims, such term is intended to be inclusive in a manner similar to the term "comprising."

What is claimed is:

1. A leadframe strip counting gauge, comprising:
   an elongate strip member having a first side portion adapted for engagement by an actuator for positioning the elongate strip member with respect to a leadframe carrier having leadframes stacked therein, the elongate strip member further having a second side portion having a periodically varying lateral edge having a spatial period that generally coincides with a spatial period of stacked leadframes residing within the leadframe carrier; and
   leadframe count indicia coupled to the elongate strip member and local to the periodically varying lateral edge, wherein the leadframe count indicia is adapted to provide an indication of a number of leadframes within the leadframe carrier.

2. The leadframe strip counting gauge of claim 1, wherein the first side portion comprises an elongate lateral edge.

3. The leadframe strip counting gauge of claim 1, wherein the periodically varying lateral edge comprises a plurality of notches generally equally spaced therealong.

4. The leadframe strip counting gauge of claim 3, wherein each notch comprises a first angled edge having a positive slope and a second angled edge having a negative slope, wherein the first and second angled edges intersect one another to form a trough.

5. The leadframe strip counting gauge of claim 4, wherein an angle formed between the first angled edge and a plane which is perpendicular to the elongate strip member positioned at the trough is about 10 degrees.

6. The leadframe strip counting gauge of claim 4, wherein an angle formed between the second angled edge and a plane which is perpendicular to the elongate strip member positioned at the trough is about negative 10 degrees.

7. A method of counting leadframes residing in a leadframe carrier, comprising the steps of:
   positioning a leadframe counting member near a leadframe carrier containing leadframes therein; and
   determining a number of leadframes in the leadframe carrier using leadframe count indicia associated with the leadframe counting member.

8. The method of claim 7, wherein positioning the leadframe counting member near the leadframe carrier comprises abutting a portion of the leadframe counting member against the leadframe carrier, wherein the engagement portion generally contacts the leadframes stacked in the leadframe carrier.

9. The method of claim 8, wherein the engagement portion comprises a periodically varying lateral edge having a spatial period that generally coincides with a spatial period of stacked leadframes residing within the leadframe carrier, and further wherein abutting the engagement portion against the leadframe carrier comprises engaging the periodically varying lateral edge with the stack of leadframes, wherein each leadframe within the stack individually engages a variation in the lateral edge.

10. The method of claim 7, wherein determining the number of leadframes comprises comparing a height of a stack of leadframes in the leadframe carrier to the leadframe count indicia.

11. The method of claim 7, wherein the leadframe count indicia are coupled to the leadframe counting member.

12. A method of counting leadframes which are stacked within a leadframe carrier, comprising the steps of:
   positioning a leadframe strip counting gauge near the stack of leadframes within the leadframe carrier; and
   determining a number of leadframes in the stack using indicia associated with the leadframe strip counting gauge.

13. The method of claim 12, wherein the leadframe strip counting gauge comprises an engagement portion having a periodically varying lateral edge with a spatial period that generally coincides with a spatial period of stacked leadframes residing within the leadframe carrier, and wherein the engagement portion is adapted for contact with the leadframes within the leadframe carrier, and wherein the periodically varying lateral edge engages the leadframes such that each leadframe strip engages a separate lateral edge variation, respectively, and wherein positioning the leadframe strip counting gauge near the stack of leadframes comprises abutting a portion of the leadframe strip counting gauge against the leadframe carrier, wherein the engagement portion generally contacts the leadframes stacked therein by engaging the periodically varying lateral edge with the stack of leadframes, wherein each leadframe within the stack individually engages a variation in the lateral edge.

14. The method of claim 13, wherein the lateral edge comprises a plurality of notches generally equally spaced along the engagement portion.

15. The method of claim 12, wherein the indicia reside on the leadframe strip counting gauge and are positioned generally vertically therealong and have a periodicity that generally coincides with a spatial periodicity of the stacked leadframes within the leadframe carrier.

* * * * *